United States Patent
Yu

(10) Patent No.: US 7,772,670 B2
(45) Date of Patent: Aug. 10, 2010

(54) METHOD OF SIMULTANEOUSLY FABRICATING ISOLATION STRUCTURES HAVING ROUNDED AND UNROUNDED CORNERS

(75) Inventor: Hsu-Sheng Yu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 127 days.

(21) Appl. No.: 11/642,304

(22) Filed: Dec. 20, 2006

(65) Prior Publication Data
US 2007/0122993 A1    May 31, 2007

Related U.S. Application Data

(62) Division of application No. 10/713,764, filed on Nov. 14, 2003, now Pat. No. 7,244,680.

(51) Int. Cl.
*H01L 27/088* (2006.01)
(52) U.S. Cl. .............. 257/499; 257/374; 257/397; 257/506; 257/510; 257/725; 257/E29.02
(58) Field of Classification Search .......... 257/374, 257/397, 499, 506, 510, 725, E29.02
See application file for complete search history.

(56) References Cited

U.S. PATENT DOCUMENTS

| 5,712,205 A * | 1/1998 | Park et al. ............... 438/425 |
| 6,281,050 B1 * | 8/2001 | Sakagami ............... 438/142 |
| 2002/0149050 A1 * | 10/2002 | Fazio et al. ............... 257/314 |

\* cited by examiner

*Primary Examiner*—Tan N Tran
(74) *Attorney, Agent, or Firm*—Stout, Uxa, Buyan & Mullins, LLP

(57) ABSTRACT

A method facilitates generally simultaneously fabricating a number of shallow trench isolation structures such that some selected ones of the shallow trench isolation structures have rounded corners and other selected ones of the shallow trench isolation structures do not have rounded corners. The method includes forming patterned photoresist over a hard mask so that portions of the hard mask are exposed over a portion of a cell region and over a portion of a periphery region, and then removing the exposed hard mask layer in the periphery region while removing a portion of the exposed hard mask layer in the cell region. A trench having rounded corners is then partially formed in the periphery region and more of the hard mask layer is removed in the cell region, before the trench in the periphery region is deepened while a trench in the cell region is formed.

14 Claims, 2 Drawing Sheets

METHOD OF SIMULTANEOUSLY FABRICATING ISOLATION STRUCTURES HAVING ROUNDED AND UNROUNDED CORNERS

CROSS-REFERENCE TO RELATED APPLICATIONS

This application is a divisional of U.S. application Ser. No. 10/713,764, filed Nov. 14, 2003 now U.S. Pat. No. 7,244,680, the entire contents of which are hereby incorporated by reference.

BACKGROUND OF THE INVENTION

1. Field of the Invention

The present invention relates generally to semiconductor fabrication methods and, more particularly, to a method for generally simultaneously fabricating a plurality of shallow trench isolation structures such that some selected ones of the shallow trench isolation structures have rounded corners and other selected ones of the shallow trench isolation structures do not have rounded corners.

2. Description of Related Art

Integrated circuits are well known. Integrated circuits are commonly used to make a wide variety of electronic devices, such as memory chips. There is a strong desire to reduce the size of integrated circuits, so as to increase the density of the individual components thereof and consequently enhance the functionality of an integrated circuit.

For example, there is a strong desire to reduce the size of the integrated circuits used to make memory chips. By reducing the size of the integrated circuits, each memory chip can have more capacity and thus be more functional.

However, the greater semiconductor component densities which result from such miniaturization inherently result in an increased potential for undesirable electrical interactions between nearby components.

For example, undesirable parasitic inter-device currents tend to be accentuated as semiconductor component densities increase. Such parasitic inter-device currents can occur when carriers, such as either electrons or electron holes, drift between adjacent active devices on a semiconductor substrate. Such drifting of carriers becomes more pronounced as the distance between active devices decreases.

Thus, in the fabrication of integrated circuits, it is frequently necessary to isolate the semiconductor components from one another, so as to mitigate the potential for such undesirable electrical interactions.

A widely used technology for isolating adjacent metal oxide semiconductor (MOS) circuits involves the local oxidation of silicon (LOCOS), in which unmasked non-active or field regions of the silicon substrate are exposed to a heated oxidizing atmosphere to thereby grow recessed or semi-recessed silicon dioxide (e.g., field oxide) areas. The silicon dioxide on the unmasked regions is generally grown thick enough to lower any parasitic capacitance which may occur over the regions of interest, but not so thick as to cause step coverage problems. As distinguished from non-active regions, regions of the substrate that are to be fabricated as active regions are protected by masking to facilitate the subsequent formation of active devices in the active regions.

However, LOCOS isolation applications are not without limitations. For example, a commonly recognized limitation is that of oxide undergrowth at the edge of the mask, wherein the silicon dioxide being grown intrudes laterally under the edge of the mask and encroaches into the active regions of the substrate. This phenomenon, which is commonly known as "bird's beak," can adversely affect device performance, reduce the area in which active devices can be built, and create stress in the substrate, while not appreciably contributing to device isolation. Moreover, as the oxide grows under the mask, the mask layer is undesirably pushed up forming a non-planar oxide defect. This non-planar defect stems, in part, from the fact that the thermally grown oxide can have approximately twice the thickness of the silicon consumed in the thermal oxidation process. Resulting non-planar formations can present problems with, for example, subsequent layer conformity and photolithography.

Recognizing the shortcomings of LOCOS isolation implementations, contemporary complimentary metal oxide semiconductor (CMOS) constructions have increasingly utilized trenches, and in particular shallow trench isolation (STI) structures, between active regions. Shallow trench isolation structure formation typically entails using a mask to define and pattern a shallow trench on a substrate using anisotropic etching processes, and then filling the shallow trench with an insulating material, followed by a subsequent step wherein the insulating material is planarized back to define the shallow trench isolation. Shallow trench isolation structures can attenuate or eliminate the "bird beak" problem of oxide intrusion into active areas, thus allowing for greater operability and smaller isolation element spacing.

Shallow trench isolation structures typically comprise abruptly-shaped sides and corners, as a result of, for example, the anisotropic etching methods which are used to form the trench isolations. These abrupt geometries may lead to undesirable electrical characteristics, such as "edge conduction" wherein excessive current leakage occurs in the upper region between the top of an isolation trench and an adjacent active device. An active device disposed in close proximity to a small-radius edge or corner of an isolation trench may exhibit, for example, a relatively high edge conduction including undesirable parasitic leakage paths. Such undesirable effects as the well known double hump of the characteristic I-V curve (see U.S. Pat. No. 6,074,931) of an active device can result.

Additionally, the sharp corners of the shallow trench isolation can also lead to difficulties in depositing the trench with dielectric filler material during subsequent processing. For example, sharp corners at the upper opening of the trench can lead to a pinching-off of that opening of the trench during dielectric deposition before the trench is completely filled, leaving an undesirable void in the trench filling. As the trend continues for component miniaturization and device density, it becomes more and more desirable to form narrower deep trench isolations having larger aspect ratios. The problem of void formation, however, can be exacerbated as the aspect ratio of the trench isolation is increased.

For example, as isolation trenches are formed with greater aspect ratios, it becomes increasingly probable that, during the filling of the isolation trench with silicon dioxide, narrowing of the opening at the mouth of the trench from the formation of the silicon dioxide will impede proper and complete filling of the trench resulting in the formation of voids.

Rounding of the corners or edges of a shallow trench isolation structure tends to mitigate at least some of the aforementioned problems associated with sharp corners thereof. However, although it is desirable to round the corners of a shallow trench isolation structure in some instances, in other instances it may not be possible, practical, or desirable to do so.

For example, in memory devices the critical dimension, i.e., the width, of the shallow trench isolation structures in the cell region is typically smaller than the critical dimension of the shallow trench isolation structures in the periphery region. Although it may be desirable to round the corners of the shallow trench isolation structures in the periphery region of the memory device to mitigate the double hump in the characteristic I-V curve thereof, this cannot be accomplished while maintaining the relatively small critical dimension of the shallow trench isolation structures in the cell region.

In this instance, corner rounding can necessitate an unacceptable reduction in the critical dimension of the shallow trench isolation structures in the cell region. Further, as discussed above, it can be relatively difficult to properly fill a shallow trench isolation structure having such a reduced critical dimension with insulating material. Thus, in this instance, it is necessary or desirable to leave the shallow trench isolation structures of the cell region unrounded.

However, it is still desirable to round the corners of the shallow trench isolation structures in the periphery of the memory device for the aforementioned reasons. Thus, it is desirable to form an integrated circuit such that some of the shallow trench isolation structures thereof have rounded corners and others of the shallow trench isolation structures thereof have unrounded corners. Of course, forming the shallow trench isolation structures having rounded corners using a different process from that used to form the shallow trench isolation structures having unrounded corners would be undesirably inefficient, costly, and likely to adversely affect yield.

A need thus exists in the prior art for a method for simultaneously forming shallow trench isolation structures having rounded edges and shallow trench isolation structures having unrounded edges.

SUMMARY OF THE INVENTION

The present invention addresses these needs by providing a method for simultaneously forming shallow trench isolation structures having rounded edges and shallow trench isolation structures having unrounded edges.

The invention herein disclosed, according to one aspect, comprises a method for forming shallow trench isolation structures, wherein the method comprises providing a substrate having a cell region and a periphery region, forming a hard mask upon the substrate so as to cover at least a portion of the cell region and at least a portion of the periphery region, forming a patterned photoresist layer upon the hard mask, the photoresist exposing a portion of the hard mask in the cell region and exposing a portion of the hard mask in the periphery region, performing a first etching process to remove the hard mask layer exposed by the photoresist layer in the periphery region and to remove a portion of the hard mask layer exposed by the photoresist layer in the cell region, performing a second etching process to partially form a trench having rounded corners in the periphery region and to remove more of the hard mask layer in the cell region, performing a third etching process to deepen the trench formed in the periphery region while maintaining the rounded corners thereof and to form a trench in the cell region, and filling the trench in the periphery region and filling the trench in the cell region with an insulating material.

According to another aspect, the present invention comprises a method for forming trenches for shallow trench isolation structures, wherein the method comprises etching a hard mask of a periphery region deeper than a hard mask of a cell region during a first etching process, etching the hard mask of the cell region further and etching the substrate of the periphery region so as to partially form a trench having rounded corners during a second etching process, and etching the substrate in the cell region so as to form a trench in the cell region and etching the substrate in the periphery region so as to deepen the trench formed therein during a third etching process.

According to another aspect, the present invention comprises method for forming trenches for shallow trench isolation structures, wherein the method comprises etching a hard mask of a periphery region approximately down to a pad oxide layer and etching a hard mask of a cell region less than down to a pad oxide layer so as to leave a remaining portion of the hard mask of the cell region during a first etching process, etching the remaining portion of the hard mask of the cell region approximately down to the pad oxide layer and etching the substrate of the periphery region so as to form a trench having rounded corners during a second etching process, and etching the substrate in the cell region so as to form a trench therein and etching the substrate in the periphery region so as to deepen the trench formed therein during a third etching process.

According to another aspect, the present invention comprises a shallow trench isolation structure formed by a process of the present invention.

According to another aspect, the present invention comprises an integrated circuit formed by a process of the present invention.

According to another aspect, the present invention comprises shallow trench isolation structures comprising a first trench formed in a peripheral region of a substrate, the first trench having rounded corners, and a second trench formed in a cell region of a substrate, the second trench having unrounded corners.

According to another aspect, the present invention comprises an integrated circuit comprising a substrate, a first trench formed in a peripheral region of the substrate, the first trench having rounded corners, and a second trench formed in a cell region of a substrate, the second trench having unrounded corners.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Figure 1:
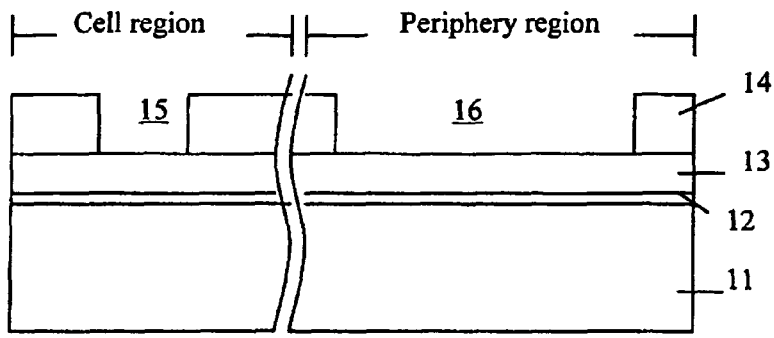
FIG. 1 is a cross-sectional view of a substrate having a pad oxide layer, a hard mask layer, and a photoresist layer formed upon cell and periphery regions thereof according to an exemplary embodiment of the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims.

It is to be understood and appreciated that the process steps and structures described herein do not cover a complete process flow for the manufacture of shallow trench isolation structures. The present invention may be practiced in conjunction with various integrated circuit fabrication techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to a method for generally simultaneously fabricating a plurality of shallow trench isolation structures such that some selected ones of the shallow trench isolation structures have rounded corners and other selected ones of the isolation structures do not have rounded corners.

According to one aspect, the present invention comprises a method for forming shallow trench isolation structures wherein the method comprises generally simultaneously forming trenches without rounded corners in a cell region of a substrate and forming trenches with rounded corners in a periphery region of a substrate.

According to this aspect, the present invention comprises providing a substrate having a cell region and a periphery region. A hard mask is formed upon the substrate so as to cover at least a portion of the cell region and at least a portion of the periphery region. A patterned photoresist layer is formed upon the hard mask such that the photoresist exposes a portion of the hard mask in the cell region and similarly exposes a portion of the hard mask in the periphery region.

A first etching process is performed to remove the hard mask layer exposed by the photoresist layer in the periphery region and to remove a portion of the hard mask layer exposed by the photoresist layer in the cell region.

A second etching process is performed to partially form a trench having rounded corners in the periphery region and to remove more of the hard mask layer in the cell region.

A third etching process is performed to deepen the trench formed in the periphery region while maintaining the rounded corners thereof and to form a trench in the cell region.

The trench in the periphery region and the trench in the cell region are both filled with an insulating material, preferably during the same processing step.

The photoresist is preferably removed after performing the third etching process. The hard mask is preferably removed after filling the trench with an insulating material.

A pad oxide layer is preferably formed upon the substrate prior to forming the hard mask thereon. The pad oxide layer is preferably removed after removing the photoresist.

The performing of the first etching process preferably comprises removing substantially all of the hard mask layer exposed by the photoresist layer in the periphery region.

The performing of the second etching process preferably comprises removing substantially all of the hard mask layer exposed by the photoresist layer in the cell region.

The corners of the trench formed in the cell region are preferably not substantially rounded.

An etching gas of the first etching process preferably comprises $CF_4/CH_2F_2$ or $CF_4/CHF_3$. An etching gas of the second etching preferably process comprises $CF_4/CHF_3$. An etching gas of the third etching process preferably comprises $Cl_2/O_2$.

The trench in the periphery region and the trench in the cell region are preferably filled with the same material. The trench in the periphery region and the trench in the cell region are preferably filled with a dielectric oxide, such as silicon dioxide. Those skilled in the art will appreciate that other dielectric materials are likewise suitable for filling the trenches.

The round corners of the trench formed in the periphery region preferably have a radius between approximately 30 nm and approximately 60 nm and preferably have a radius of approximately 60 nm.

The trench in the periphery region and the trench in the cell region are preferably formed so as to have approximately the same depth. However, the trench in the periphery region and the trench in the cell region may alternatively have different depths with respect to one another.

Referring more particularly to the drawings, FIGS. 1-5 depict a preferred embodiment of the present invention, wherein shallow trench isolation structures having rounded corners or edges are formed generally simultaneously with shallow trench isolation structures having unrounded or generally square corners or edges.

Those skilled in the art will appreciate that although the structures 19 are depicted in the drawings as corners, these structures are actually edges along the uppers sides of the trenches. The terms corners and edges are thus generally used interchangeably herein.

Referring now to FIG. 1, a substrate 11 comprises a cell region and a periphery region as labeled in the drawing. The substrate 11 may comprise a silicon substrate such as those commonly used in the manufacture of integrated circuits such as memory devices. Alternatively, the substrate 11 may comprise any other desired material.

A pad oxide layer 12 can be formed upon the substrate 11. As those skilled in the art will appreciate, the pad oxide layer 12 mitigates stresses due to crystalline structure mismatch between the substrate 11 and a subsequently applied hard mask layer 13 according to well know principles.

According to the preferred embodiment of the present invention, a hard mask layer 13 can be formed upon the substrate 11, preferably upon the pad oxide layer 12. The hard mask layer 13 preferably comprises silicon nitride. However, as those skilled in the art will appreciate, the hard mask layer may alternatively comprises various other materials. The hard mask layer 13, in cooperation with a subsequently applied photoresist layer 14, provides a mask which determines which portions of the substrate will be etched, have materials deposited thereon, or be otherwise processed according to well known principles.

A patterned photoresist layer 14 can be formed upon the hard mask layer 13. The patterned photoresist layer 14 has openings 15 and 16 patterned therein to facilitate similar patterning of the hard mask 13, so as to subsequently facilitate etching of and material deposition upon underlying materials according to well known principles. Those skilled in the art will appreciate that various other methods for patterning the hard mask 13 are likewise suitable. For example, the hard mask 13 may alternatively be patterned via laser cutting or ion milling.

Some of the openings 15 formed in the photoresist layer 14 can be formed over the cell region of the substrate 11, so as to facilitate the formation of trenches having unrounded corners. As discussed above, it is sometimes desirable to form trenches having unrounded corners so as to better maintain the critical dimension thereof. This is particularly true when the trenches are being formed in a region which is densely populated with semiconductor devices, such that the critical dimension of the trenches must be maintained to avoid physical interference with the adjacent semiconductor devices.

Some of the openings 16 formed in the photoresist layer 14 can similarly be formed over the periphery region of the substrate 11, so as to facilitate the formation of trenches having rounded corners. As discussed above, it is sometimes desirable to form trenches having rounded corners so as to mitigate the double hump of the characteristic I-V curve of nearby semiconductor devices.

As shown in FIG. 1, the opening 15 in the photoresist 14 over the cell region is comparatively small with respect to the opening 16 formed in the photoresist 14 over the periphery region. The comparatively small opening 15 facilitates the formation of a shallow trench isolation structure having a comparatively small critical dimension in the cell region, while the comparatively large opening 16 facilitates the formation of a shallow trench isolation structure having a comparatively large critical dimension in the periphery region.

It is worthwhile to note that in the practice of the present invention, such as upon a wafer in a chemical vapor deposition (CVD) process, many such cell regions and many such periphery regions may exist in close proximity to one another.

Figure 2:
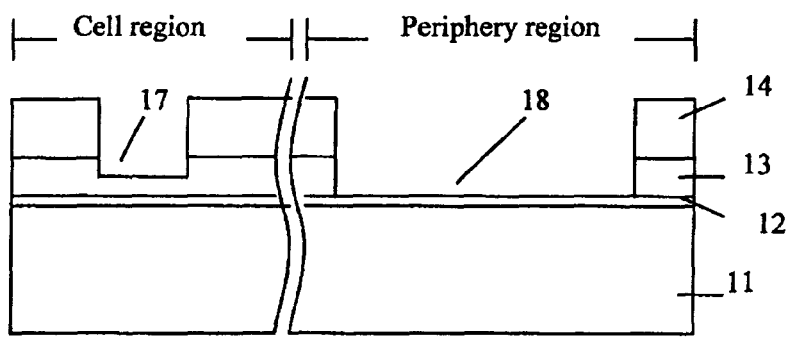
FIG. 2 is a cross-sectional view showing removal of a portion of the exposed hard mask in the cell region and showing removal of substantially all of the exposed hard mask in the periphery region.

Referring now to FIG. 2, a first etching process is performed to partially remove a portion of the exposed hard mask 13 in the cell region to form an etched portion 17 therein and to substantially completely remove all of the exposed hard mask 13 in the periphery region to form an etched portion 18 therein. Thus, in the periphery region the hard mask 13 is preferably etched all of the way down to the pad oxide layer 12.

As those skilled in the art will appreciate, such removal of material to a selected depth may be facilitated by a variety of methodologies. For example, the hard mask 13 in the cell region may be treated so as to be thicker or otherwise more resistant to etching with respect to the hard mask 13 in the periphery region.

In etching processes, etching micro-loading effects can exist in different critical dimensions. General hard mask opening techniques may seek to reduce these effects with low polymer gas (e.g., $CF_4$, $CF_4/O_2$). In accordance with an aspect of the invention, high polymer gas (e.g., $CHF_3$, $CH_2F_2$) can be added to selectively enhance etching micro-loading effects. Using this approach, a larger hard mask can be achieved in the cell region while the hard mask of periphery region is fully etched.

An etching gas of the first etching process preferably comprises $CF_4/CH_2F_2$ or $CF_4/CHF_3$. The ratio of $CF_4$ to $CH_2F_2$ is preferably about 2 to about 5. The ratio of $CF_4$ to $CHF_3$ is preferably about 3 to about 5. Those skilled in the art will appreciate that other etching gases and other rations are likewise suitable.

Figure 3:
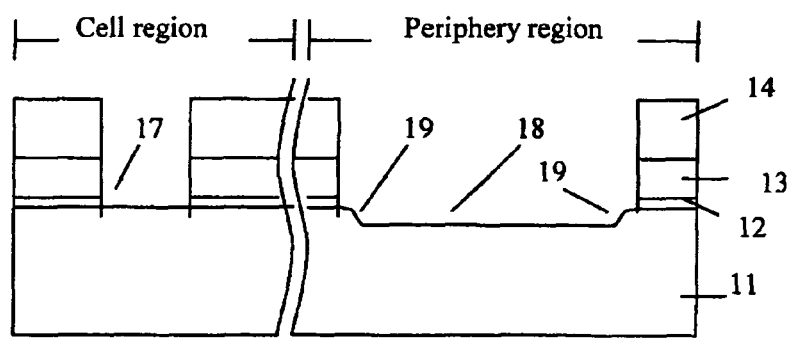
FIG. 3 is a cross-sectional view showing removal of the remainder of the exposed hard mask, as well as the pad oxide layer therebeneath, in the cell region and showing the beginning of the formation of a trench in the exposed substrate of the periphery region, wherein the trench has rounded corners.

Referring now to FIG. 3, a second etching process is performed to remove the remaining hard mask in the cell region and optionally to begin forming a trench in the cell region. Any trench which begins to be formed in the cell region has generally square or unrounded corners. At the same time, the second etching process begins forming a trench in the periphery region, such that the trench in the periphery region has rounded top corners 19.

To generate corner rounding in the periphery region using for example $CF_4/CHF_3$ gas a heavy polymer forming near sidewall of the trench is implemented as the trench begins to form. Using sidewall polymer deposition the top rounding can naturally be formed.

Preferably, the etched portion 17 in the cell region extends through the pad oxide layer 13 and the etched portion 18 of the periphery region extends substantially into the substrate 11 after the second etching process.

An etching gas of the second etching process preferably comprises $CF_4/CHF_3$. The ratio of $CF_4$ to $CHF_3$ is preferably about 4 to about 6. Those skilled in the art will appreciate that other etching gases and other ratios are likewise suitable.

Figure 4:
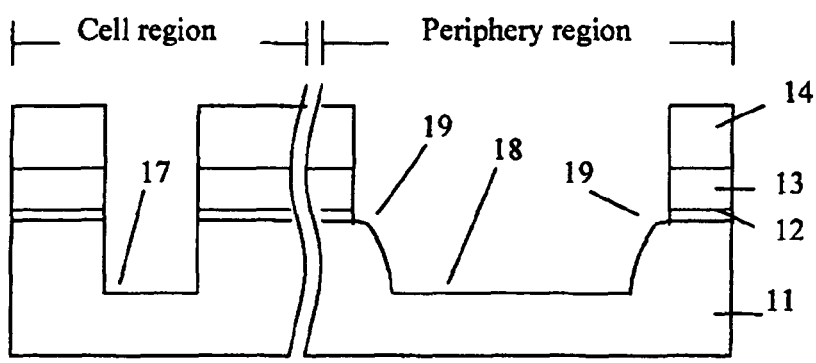
FIG. 4 is a cross-sectional view showing formation of a trench in the cell region of the substrate and showing completion of the formation of a trench in the substrate of the periphery region.

Referring now to FIG. 4, a third etching process is performed to form a trench 17 in the substrate 11 in the cell region thereof and to complete the trench 18 in the substrate 11 in the periphery region thereof. The corners of the trench 17 in the cell region remain substantially square or unrounded and the corners 19 of the trench 18 in the periphery region remain substantially rounded.

An etching gas of the third etching process preferably comprises $Cl_2/O_2$. The ratio of $Cl_2$ to $O_2$ is preferably about 6 to about 12, and the etching gas plasma in this embodiment contains 60-120 sccm $Cl_2$ and 5-12 sccm $O_2$. Those skilled in the art will appreciate that other etching gases may likewise be suitable.

Figure 5:
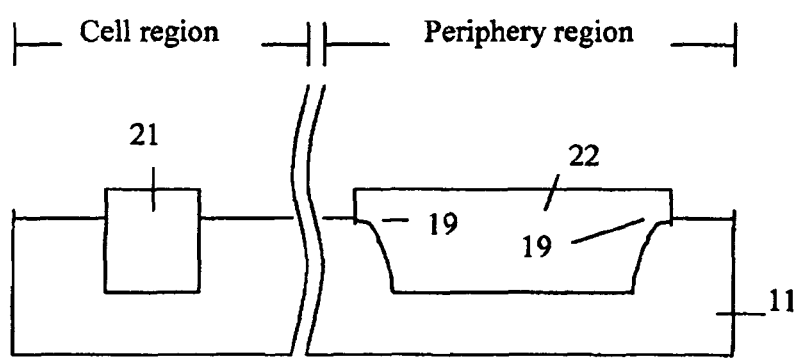
FIG. 5 is a cross-sectional view showing the trench of the cell region and the trench of the periphery region both filled with an insulating material.

Referring now to FIG. 5, the photoresist layer 14 is removed and an insulating material 21, 22, such as silicon dioxide, is deposited within the trenches 17, 18, so as to form shallow trench isolation structures.

After depositing the insulating material 21, 22 within the trenches 17, 18, the hard mask 17 and the optional pad oxide layer 12 are preferably removed.

The shallow trench isolation structure in the cell region has substantially square or unrounded corners, so as to maintain the critical dimension thereof (since for example rounded corners would tend to intrude undesirably upon adjacent active devices). The shallow trench isolation structure in the periphery region has substantially rounded corners 19, which tend to mitigate the double hump of the characteristic I-V curve of adjacent active devices.

The shallow trench isolation structures having square corners of the cell region and the shallow trench isolation structures having rounded corners of the periphery region are thus formed simultaneously, so as to mitigate the need for additional processing steps which would tend to undesirably decrease yield and increase costs.

In view of the foregoing, it will be understood by those skilled in the art that the methods of the present invention can facilitate formation of shallow trench isolation structures having predetermined rounded or unrounded corners. The above-described embodiments have been provided by way of example, and the present invention is not limited to these examples. Multiple variations and modifications to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. Shallow trench isolation structures comprising:
   an enlarged trench formed in a peripheral region of a substrate, the enlarged trench having rounded top corners, unrounded bottom corners, and a planar bottom;
   a small trench formed in a cell region of the substrate, the small trench having unrounded top corners, unrounded bottom corners, and a planar bottom; and
   insulating material deposited within the enlarged trench and the small trench simultaneously.

2. The shallow trench isolation structures as set forth in claim 1, wherein the rounded top corners of the trench formed in the periphery region have a radius between approximately 30 nm and approximately 60 nm.

3. The shallow trench isolation structures as set forth in claim 1, wherein the rounded top corners of the trench formed in the periphery region have a radius of about 60 nm.

4. The shallow trench isolation structures as set forth in claim 1, wherein the trench in the periphery region and the trench in the cell region are formed so as to have approximately the same depth.

5. The shallow trench isolation structures as set forth in claim 1, wherein the trench in the periphery region and the trench in the cell region are filled with the same material.

6. The shallow trench isolation structures as set forth in claim 1, wherein the trench in the periphery region and the trench in the cell region are filled with an oxide during a single processing step.

7. The shallow trench isolation structures as set forth in claim 1, wherein the trench in the periphery region and the trench in the cell region are filled with silicon dioxide.

8. An integrated circuit comprising:
   a substrate having a peripheral region and a cell region;
   an enlarged trench formed in the peripheral region of the substrate, the enlarged trench having rounded top corners, unrounded bottom corners, and a planar bottom;
   a small trench formed in the cell region of the substrate, the small trench having unrounded top corners, unrounded bottom corners, and a planar bottom; and
   insulating material deposited within the enlarged trench and the small trench simultaneously.

9. The integrated circuit as set forth in claim 8, wherein the rounded top corners of the trench formed in the periphery region have a radius between approximately 30 nm and approximately 60 nm.

10. The integrated circuit as set forth in claim 8, wherein the rounded top corners of the trench formed in the periphery region have a radius of about 60 nm.

11. The integrated circuit as set forth in claim 8, wherein the trench in the periphery region and the trench in the cell region are formed so as to have approximately the same depth.

12. The integrated circuit as set forth in claim 8, wherein the trench in the periphery region and the trench in the cell region are filled with the same material.

13. The integrated circuit as set forth in claim 8, wherein the trench in the periphery region and the trench in the cell region are filled with an oxide during a single processing step.

14. The integrated circuit as set forth in claim 8, wherein the trench in the periphery region and the trench in the cell region are filled with silicon dioxide.

* * * * *